United States Patent
Vermeulen et al.

(10) Patent No.: US 12,535,746 B2
(45) Date of Patent: Jan. 27, 2026

(54) LITHOGRAPHIC APPARATUS STAGE COUPLING

(71) Applicant: ASML NETHERLANDS B.V., Veldhoven (NL)

(72) Inventors: Johannes Petrus Martinus Bernardus Vermeulen, Leende (NL); Johannes Adrianus Leonardus De Goeij, Utrecht (NL); René Wilhelmus Antonius Hubertus Leenaars, Eindhoven (NL); Bas Jansen, Rosmalen (NL); Ron Geeraard Catharina De Bruijn, Arendonk (BE)

(73) Assignee: ASML NETHERLANDS B.V., Veldhoven (NL)

( * ) Notice: Subject to any disclaimer, the term of this patent is extended or adjusted under 35 U.S.C. 154(b) by 97 days.

(21) Appl. No.: 18/699,654

(22) PCT Filed: Oct. 27, 2022

(86) PCT No.: PCT/EP2022/080138
§ 371 (c)(1),
(2) Date: Apr. 9, 2024

(87) PCT Pub. No.: WO2023/078788
PCT Pub. Date: May 11, 2023

(65) Prior Publication Data
US 2024/0402622 A1    Dec. 5, 2024

(30) Foreign Application Priority Data
Nov. 3, 2021  (EP) .................................... 21206110

(51) Int. Cl.
*G03F 7/00* (2006.01)
*F16F 1/377* (2006.01)
*F16F 1/44* (2006.01)

(52) U.S. Cl.
CPC .............. *G03F 7/709* (2013.01); *F16F 1/377* (2013.01); *F16F 1/44* (2013.01); *G03F 7/70725* (2013.01);
(Continued)

(58) Field of Classification Search
CPC .... F16F 1/377; F16F 1/428; F16F 1/44; F16F 1/445; F16F 1/46; F16F 2228/066;
(Continued)

(56) References Cited

U.S. PATENT DOCUMENTS 2,552,668 A    5/1951  Dath
6,020,964 A    2/2000  Loopstra et al.
(Continued)

FOREIGN PATENT DOCUMENTS

CN    112096739    12/2020
DE    29610365    6/1996
(Continued)

OTHER PUBLICATIONS

International Search Report and Written Opinion issued in corresponding PCT Patent Application No. PCT/EP2022/080138, dated Feb. 10, 2023.

(Continued)

*Primary Examiner* — Peter B Kim
(74) *Attorney, Agent, or Firm* — Pillsbury Winthrop Shaw Pittman, LLP

(57) ABSTRACT

A coupling having a variable stiffness is disclosed. The coupling includes: a deformable component and a support being movably arranged with respect to each other, wherein the deformable component includes a viscoelastic material, wherein the support has a recess configured to receive the deformable component, wherein the deformable component is configured to deform in volumetric deformation when, in use, a force is applied to the deformable component, and wherein a shape of the deformable component and a shape of the support are configured such that the variable stiffness gradually increases as a function of an amount of the force. A stage apparatus may have the coupling.

20 Claims, 8 Drawing Sheets

(52) U.S. Cl.
CPC .... *G03F 7/70758* (2013.01); *F16F 2228/066* (2013.01)

(58) Field of Classification Search
CPC ............. G03F 7/70716; G03F 7/70725; G03F 7/70758; G03F 7/709; G03F 7/70775
See application file for complete search history.

(56) References Cited

U.S. PATENT DOCUMENTS

| | | | |
|---|---|---|---|
| 6,952,253 | B2 | 10/2005 | Lof et al. |
| 2007/0058173 | A1 | 3/2007 | Holzapel |
| 2017/0010543 | A1 | 1/2017 | Aangenent et al. |
| 2017/0108531 | A1* | 4/2017 | Witvoet ................ G01Q 10/04 |
| 2018/0320739 | A1 | 11/2018 | Okwudire et al. |
| 2021/0373446 | A1* | 12/2021 | Huang ................ G03F 7/70775 |

FOREIGN PATENT DOCUMENTS

| | | |
|---|---|---|
| DE | 202014102562 | 7/2014 |
| JP | H11168064 | 6/1999 |
| JP | 2000120780 | 4/2000 |
| TW | 201329363 | 7/2013 |
| WO | 2015/113861 | 8/2015 |
| WO | WO-2025093202 A1 * | 5/2025 ............. G03F 7/709 |

OTHER PUBLICATIONS

M. F. Heertjes et al., "Acceleration-snap feedforward scheme for a motion system with viscoelastic tuned-mass-damper," 2017 American Control Conference (ACC), Seattle, WA, USA, pp. 2888-2893 (2017).

* cited by examiner

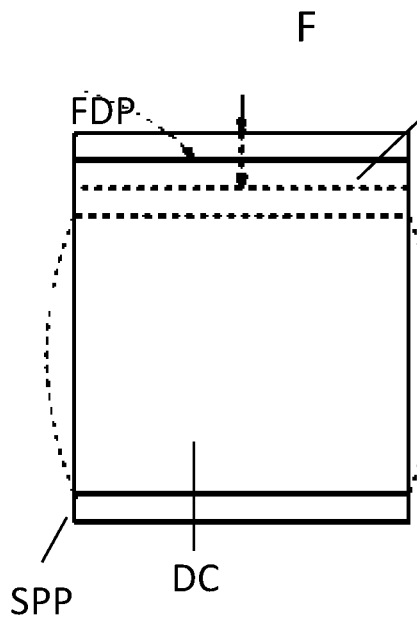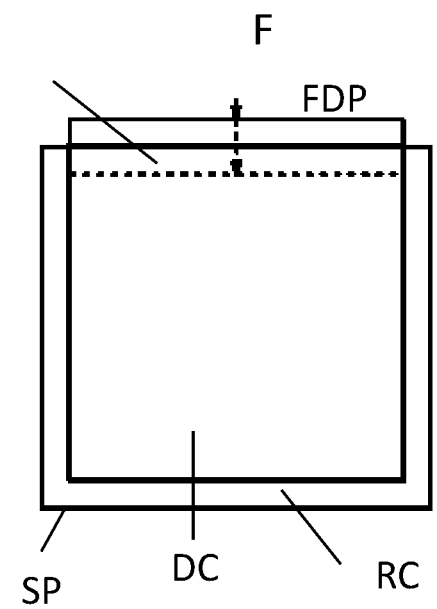
Fig. 4A  Fig. 4B
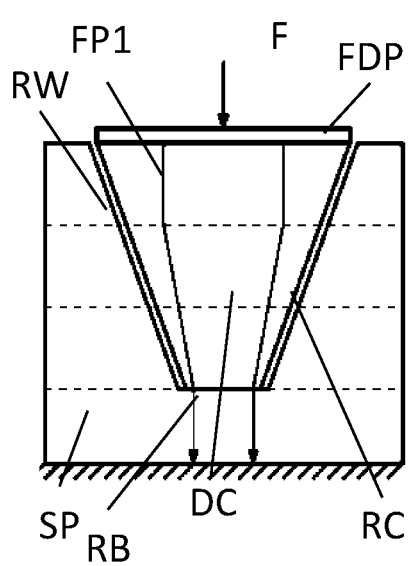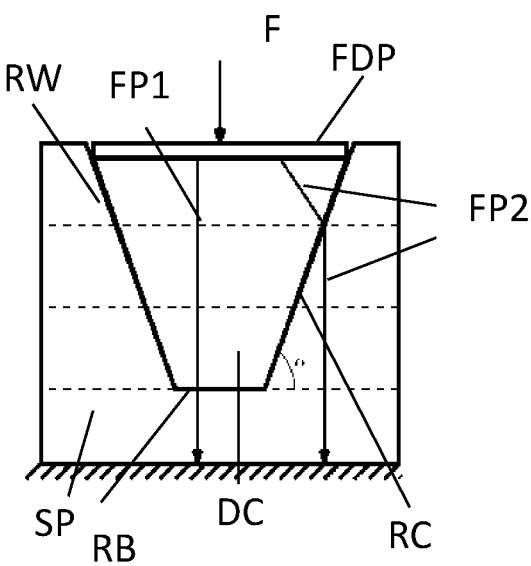
Fig. 5A  Fig. 5B

LITHOGRAPHIC APPARATUS STAGE COUPLING

CROSS-REFERENCE TO RELATED APPLICATIONS

The application is the U.S. national phase entry of PCT Patent Application No. PCT/EP2022/080138 which was filed on Oct. 27, 2022, which claims priority of European Patent Application No. 21206110.5 which was filed on Nov. 3, 2021, and which is incorporated herein in its entirety by reference.

FIELD

The present invention relates to a coupling, a stage apparatus comprising such a coupling and an apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

A stage, such as a substrate stage or mask stage of the lithographic apparatus may make use of a long stroke, short stroke actuator configuration, whereby a long stroke actuator provide for a coarse positioning over a long range of movement, while the short stroke actuator provide for an accurate positioning over a short range of movement.

For the short stroke actuator, it is desirable to achieve a high accuracy of actuation combined with a high bandwidth. For example, a use of piezoelectric actuators is envisaged. Piezo electric actuators however may exhibit a high stiffness, which may result in a high transmissibility of disturbances, such as vibrations, shocks, etc., via the piezo electric actuators from the long stroke stage into the short stroke stage position. The stiffness and resulting transmissibility of disturbances, may have a significant deteriorating effect on overlay performance.

SUMMARY

Considering the above, it is an object of the invention to provide a lithographic apparatus having a high overlay performance.

According to an embodiment of the invention, there is provided a coupling having a variable stiffness comprising:
a deformable component and a support being movably arranged with respect to each other, wherein the deformable component comprises a viscoelastic material and wherein the support has a recess configured to receive the deformable component,
wherein the deformable component is configured to deform in volumetric deformation when, in use, a force is applied to the deformable component, and
wherein a shape of the deformable component and a shape of the support are configured such that the variable stiffness gradually increases as a function of an amount of the force According to a further embodiment of the invention, there is provided a stage apparatus comprising:
a table configured to support an object,
an intermediate body,
a short stroke actuator arranged between the table and the intermediate body and configured to actuate the table in respect of the intermediate body,
a carrier,
long stroke actuators configured to actuate the carrier,
a coupling configured to vary the stiffness thereof between a low stiffness and a high stiffness in dependence of a force applied to the coupling, the coupling configured to support the intermediate body in respect of the carrier.

According to a further embodiment of the invention, there is provided a stage apparatus comprising:
a table configured to support an object,
an intermediate body,
a short stroke actuator arranged between the table and the intermediate body and configured to actuate the table in respect of the intermediate body,
a carrier,
long stroke actuators configured to actuate the carrier, and
a coupling according to the invention, the coupling configured to support the intermediate body in respect of the carrier.

According to a yet further embodiment of the invention, there is provided an apparatus, such as a lithographic apparatus, a metrology apparatus or an inspection apparatus, comprising a stage apparatus according to the invention.

BRIEF DESCRIPTION OF THE DRAWINGS

Embodiments of the invention will now be described, by way of example only, with reference to the accompanying schematic drawings, in which:

FIGS. 4A and 4B depict highly schematic views of respective deformable components;

FIGS. 5A and 5B depict highly schematic views of an embodiment of a coupling;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
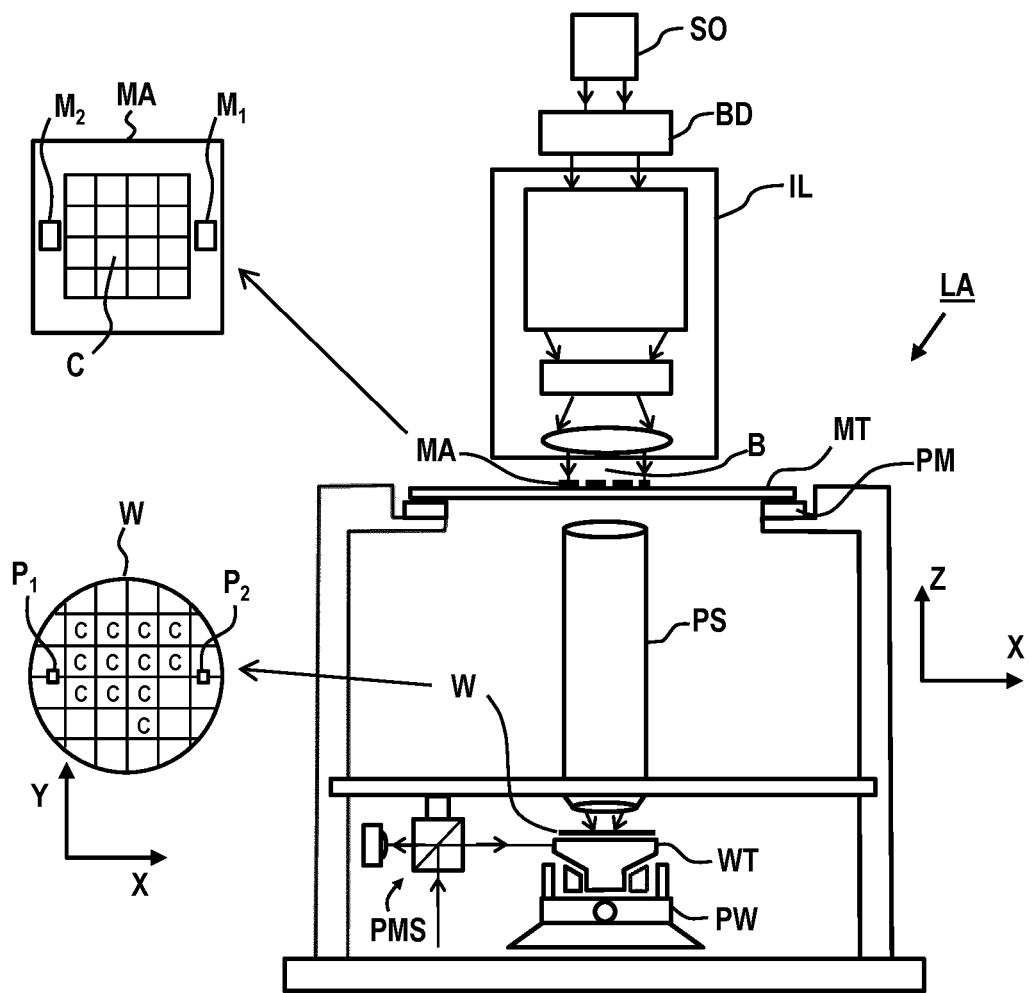
FIG. 1 depicts a schematic overview of a lithographic apparatus according to an embodiment of the invention.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
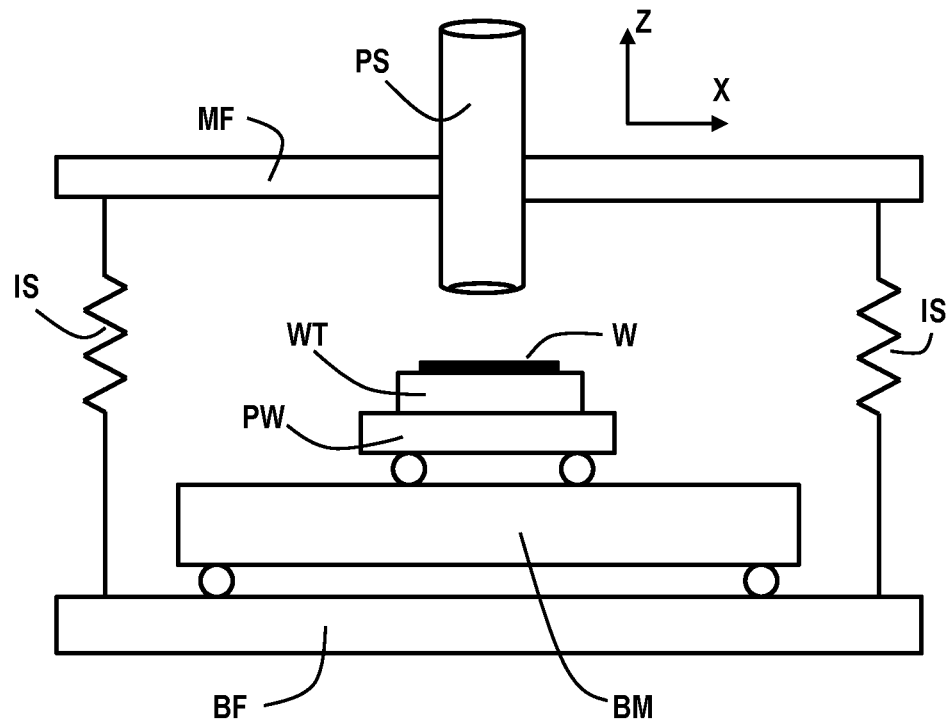
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads is arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
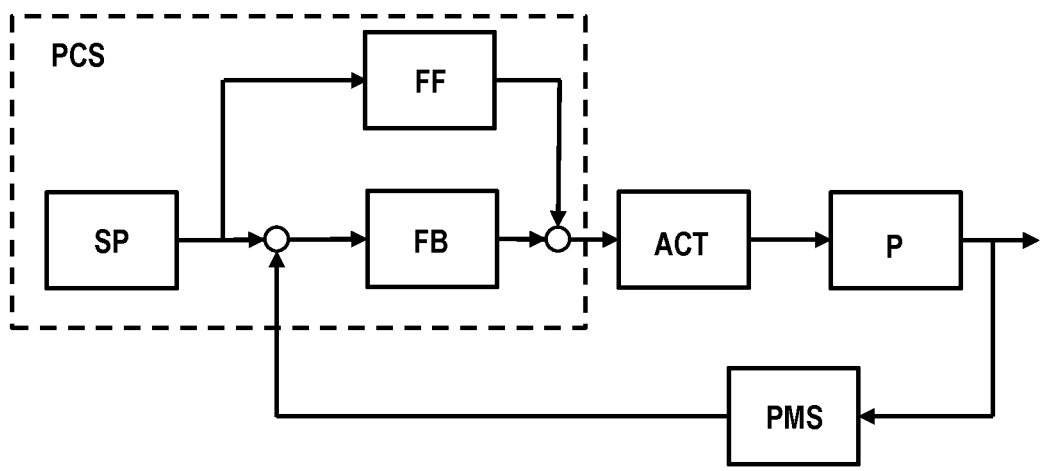
FIG. 3 schematically depicts a position control system as part of a positioning system according to an embodiment of the invention.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

FIG. 4A depicts a deformable component DC which is arranged on a support plate SPP, while FIG. 4B depicts a deformable component which is arranged in a recess of a support SP. The deformable component may be understood as a component which is deformable, in that a force applied onto the component provides the component to deform. The deformable component may comprise a viscoelastic material, such as for example rubber, or more broadly synthetic polymers.

Both in FIG. 4A and FIG. 4B, a force F is applied onto the deformable component, the force in the present example in a vertical direction. FIGS. 4A and 4B illustrate a deformation of the viscoelastic material of the deformable component in two different moduli, as follows.

In FIG. 4A, the deformable component is enabled to deform laterally under axial tension or compression, in the present example at the sides thereof, resulting in an axial deformation DEF seen along the direction of the force applied, and a lateral deformation caused by lateral expansion or contraction. The deformation may be identified as elastic deformation according to the Young's modulus. Young's modulus, or the modulus of elasticity in tension or compression, is a mechanical property that measures the tensile or compressive stiffness of a solid material when the force is applied lengthwise. It quantifies as a quotient between tensile/compressive stress and axial strain (proportional deformation) in the linear elastic region of a material.

In FIG. 4B, the deformable component is more or less uniformly constrained in all directions in a recess, providing that the deformation DEF will be volumetric, the related modulus, which may be defined as volumetric stress over volumetric strain, is identified as Bulk modulus.

A difference between the stiffness of the deformable material in the Young's modulus and the stiffness of the deformable material in the Bulk modulus, for viscoelastic materials, may be in an order of magnitude of e.g. 100-300. In particular, the difference between the stiffness of the deformable material in the Young's modulus and the stiffness of the deformable material in the Bulk modulus may be approximately a factor 167 at a Poisson ratio of 0.499, such as may be the case when the viscoelastic material is rubber. The viscoelastic deformable material may exhibit a different stiffness when subject to confined volumetric deformation, such as in the configuration depicted in FIG. 4B versus free axial deformation such as in the configuration depicted in FIG. 4A.

FIGS. 5A and 5B depict an embodiment of a coupling. The coupling comprises a support SP comprising a recess RC and a deformable component DC which is arranged in the recess. In the present embodiment, the recess comprises a recess bottom RB and a recess side wall RW which extends from the bottom surface up to an entry of the recess. The deformable component bears against the recess bottom, the deformable component may be arranged to be connected to the recess bottom. A force F may be applied onto the deformable component, pushing the deformable component into the recess. FIG. 5A depicts an initial position, i.e. a position of the deformable component at an initial or low value of the force F. In the initial position, the deformable component supports on the recess bottom, while the deformable component is free from the recess side wall, i.e. does not support against the recess side wall. As the force F increases, the deformable component deforms to be confined by the recess. Accordingly, the part of the surface of the recess on which the deformable component supports, is increased.

The more a part of the surface of the recess on which the deformable component supports, increases, the more the deformation of the deformable component transitions from a free axial deformation according to the Young's modulus to a confined volumetric deformation according to the Bulk modulus. As a result, as the force increases, the stiffness of the deformable component increases from the stiffness associated with the elastic axial deformation (Young's modulus) to the stiffness associated with the volumetric deformation (Bulk modulus).

As the deformable component is pushed by the force into the recess, it will be at least partly confined by the recess. The more the amount of the force increases, the more the deformable component will be confined by the recess. The confinement, at least in part, of the deformable component providing that the deformable component changes from axial deformation to volumetric deformation. The larger a part of the deformable component that is confined by the recess, i.e. the larger the part of the deformable component bears against a surface of the recess, the more the deformable component transitions from axial deformation to volumetric deformation, and the higher the stiffness of the coupling.

In order for the force to be applied onto the deformable component, a force distribution structure may be provided, such as in the present embodiment the force distribution plate FDP, which bears against a side of the deformable component that faces away from the recess (and is designed not to be in contact with the recess at all times to avoid large impact forces).

The coupling may be understood as to comprise a device that mechanically couples a first structure to a second structure.

The stiffness of a coupling may be defined as the extent to which the coupling resists deformation in response to an applied change in force on the coupling.

The support may comprise any suitable material. Generally, a stiffness of the support will be higher than a stiffness of the deformable component, preferably higher than a stiffness of the deformable component in the bulk modulus.

Viscoelasticity may be defined as the property of materials that exhibit both viscous and elastic characteristics when undergoing deformation. Viscous materials resist shear flow and strain linearly with time when a stress is applied. Elastic materials strain when stretched and immediately return to their original state once the stress is removed. Viscoelastic materials may have elements of both of these properties and, as such, may exhibit time-dependent strain. Whereas elasticity is usually the result of bond stretching along crystallographic planes in an ordered solid, viscosity is the result of the diffusion of atoms or molecules inside an amorphous material.

In the embodiment as depicted in FIGS. 5A and 5B, the recess tapers towards the recess bottom, i.e. the recess side wall tapers towards the recess bottom. Similarly, the deformable component tapers towards the bottom thereof which support on the recess bottom of the recess. As a result, as depicted in FIG. 5A, a path FP1 of the force extends through the deformable component from the force distribution structure to the recess bottom of the recess. Contrarily, as depicted in FIG. 5B, where the deformable component is deformed and bears against the recess bottom as well as the recess side wall, the path of the force only partially or even marginally extends through the deformable component from the force distribution structure FDP to the recess bottom of the recess, as indicated by force path FP1, and the path increasingly extends from the force distribution structure FDP to the recess side wall of the recess, as indicated by force path FP2. As a length of the path through the deformable component from the force distribution structure to the recess side wall is shorter compared to the length of the path from the force distribution structure to the recess bottom, an effective length of the path through the deformable structure is reduced, hence increasing a stiffness, as the part of the path extending through the support encounters the high stiffness of the support. As a result of the decreased length of the path through the deformable component, a stiffness is increased. This effect may be promoted in that the (sharp) angle of the recess side wall in respect of the recess bottom is reduced, i.e. the tapering being increased. Due to the tapering, the above-described difference in stiffness between the axial mode as occurring in the state depicted FIG. 5A and the bulk mode as occurring in the state depicted FIG. 5B may be even further enhanced from a factor in a range of 100-300 as would be the case without the tapering, to a factor in a range of approx. 1000-10.000.

Although FIGS. 5A and 5B depict a tapering of the recess, the recess may converge in any other way, e.g. the recess may parabolically converge. The shape of the recess may be formed to increase the stiffness transition and/or to increase lifetime (e.g. by decreasing relative motion tangentially to a contact surface between cup and cone). In an embodiment the recess may converge according to a polynomial or logarithmic/exponential function.

Figure 6:
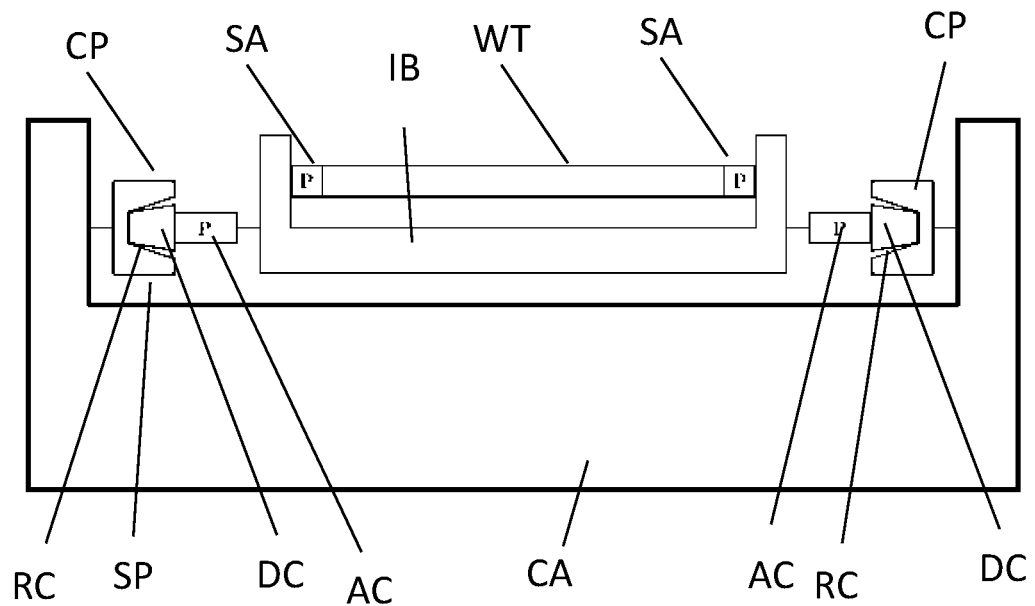
FIG. 6 depicts a highly schematic view of an embodiment of a stage.

FIG. 6 depicts a schematic view of a stage apparatus. The stage apparatus comprises a wafer table WT configured to support a wafer. A short stroke actuator SA is arranged between the wafer table and an intermediate body IB and is configured to actuate the wafer table in respect of the intermediate body, thus to position the wafer table in respect of the intermediate body. The stage apparatus further comprises a carrier CA and long stroke actuators (not depicted in FIG. 6) configured to actuate the carrier. The short stroke actuator may for example comprise a piezo actuator. Piezo actuators enable to actuate the wafer table at a small moving mass and at a high bandwidth and with corresponding short settling times. However, due to the high intrinsic stiffness of the piezo actuators, transmission of vibrations and other disturbances via the piezo actuators onto the wafer table may be high, which may result in e.g. overlay errors of the lithographic apparatus comprising such a stage apparatus.

According to the present embodiment, the stage apparatus comprises a coupling CP, as described above with reference to FIGS. 5A and 5B, the coupling configured to support the intermediate body in respect of the carrier, at least in, but not limited to, the long stroke driving direction of the stage. As the coupling is arranged between the intermediate body and the carrier, the intermediate body may be isolated from vibrations or other disturbances in case the coupling exhibits a low stiffness. On the other hand, high accelerations and/or fast settling times of the wafer table may be achieved as the coupling exhibits a high stiffness. As the coupling is arranged along a force path between the intermediate body and the carrier, forces acting on the intermediate body will be guided through the coupling, causing the coupling to vary the stiffness thereof in response to the forces. Therefore, in case of acceleration of the wafer table, e.g. by actuation of the long stroke actuators, a force may be transferred from the carrier via the coupling onto the intermediate body, the force acting on the coupling therefore affecting a stiffness of the coupling to increase a stiffness of the coupling as the force pushes the deformable component into the recess. The stiffness of the coupling is increased as described above with reference to FIGS. 5A and 5B.

The coupling may be arranged along a force path between the intermediate body and the carrier, whereby a force from the carrier acts on the intermediate body via the coupling. The force acting from the carrier via the coupling on the intermediate body may push the deformable component into the recess. As a result, a stiffening may be obtained e.g. in response to a force causing the stage to accelerate. For example, the deformable component may be connected to the intermediate body and the support may be connected to the carrier, causing the deformable component DC to be pushed into the recess RC of the support SP as the carrier CA accelerates. Alternatively, the deformable component may be connected to the carrier and the support may be connected to the intermediate body.

As depicted in FIG. 6, the stage may be provided with two couplings which may be arranged in opposite direction seen along an axis of movement of the stage. Thereby, forces in opposite direction may provide a similar effect: a force in one direction may provide that the deformable component of one of the couplings is pushed into the recess, thereby increasing a stiffness of the one of the couplings, while a force in the other direction may provide that the deformable component of the other one of the couplings is pushed into the recess, thereby increasing a stiffness of the other one of the couplings. As a result, a similar stiffening may be obtained e.g. in response to forces in both directions, e.g. forces causing the stage to accelerate and decelerate in both directions.

In an embodiment, the coupling is provided with an additional actuator AC configured to exert an actuator force onto the deformable component to push the deformable component into the recess. In the embodiment depicted in FIG. 6, each one of the couplings is provided with such an actuator. The actuator may be driven by a control device of the stage, such as a stage controller. The actuator may for example be employed to improve a control of the stiffness of the coupling: in case a high stiffness is desired, the actuator may be driven to push the deformable component into the recess of the coupling to increase preload. Furthermore, the actuator may enhance a range of stiffness to be achieved: as the actuator force by the actuator for example enhances the force acting on the coupling, e.g. the force from the carrier via the coupling on the intermediate structure. Still further, a dynamic behavior may be improved, e.g. in that a response time of the coupling to change from high stiffness to low stiffness may be enhanced by appropriate actuator dynamics, allowing for enhanced settling behavior of the intermediated body.

Figure 7:
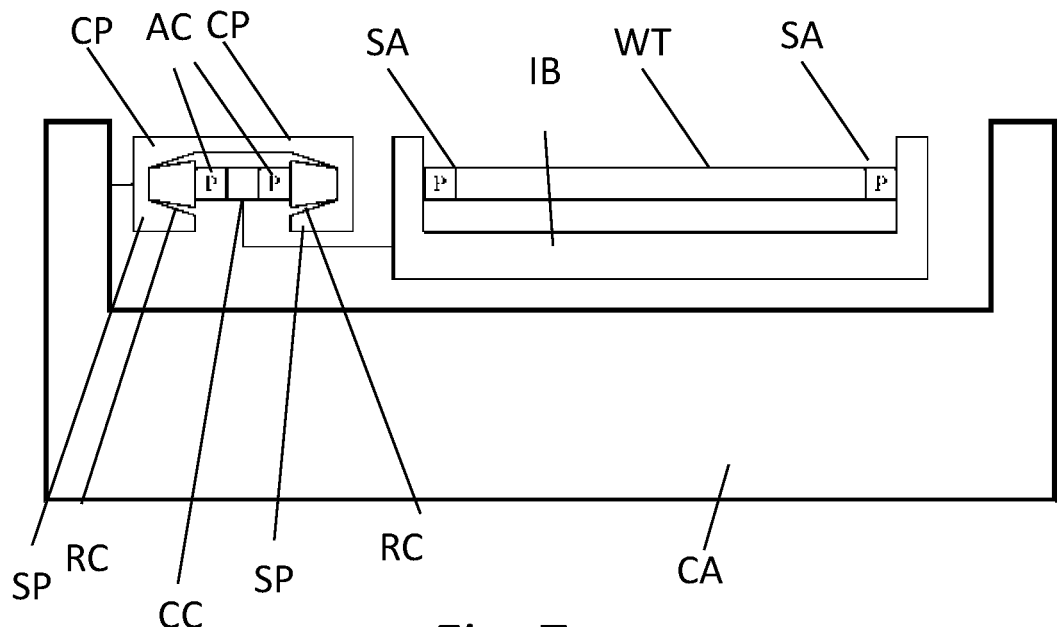
FIG. 7 depicts a highly schematic view of another embodiment of a stage.

FIG. 7 depicts another embodiment of a stage apparatus. Likewise to the stage apparatus as depicted in and described with reference to FIG. 6, the stage apparatus as depicted in FIG. 7 comprises a wafer table WT configured to support a wafer W. A short stroke actuator SA is arranged between the water table and an intermediate body IB and is configured to actuate the wafer table in respect of the intermediate body, thus to position the wafer table in respect of the intermediate body. The stage apparatus further comprises a carrier CA and long stroke actuators (not depicted in FIG. 7) configured to actuate the carrier. The short stroke actuator may for example comprise a piezo actuator.

In the embodiment depicted in FIG. 7, the stage apparatus comprises two couplings arranged in opposite directions, seen along an axis of movement of the stage. The supports of the two couplings are rigidly connected to each other and to the carrier. The recesses of the two couplings face each other. Furthermore, the stage apparatus comprises a connecting component CC that connects the deformable components of the couplings to each other and to the intermediate body. As a result, in case one of the actuators of the couplings is actuated, or both actuators are actuated, the force exerted by the actuator is guided via the connecting component to the other one of the couplings, whereby the intermediate body is bypassed. Thus, the force path from the one of the couplings to the other one of the couplings, which in the embodiment in accordance with FIG. 6 passes through the intermediate body, may be guided through the connecting component, thereby avoiding a load onto the intermediate body which load could translate into a position error, internal deformation or disturbance on the wafer table. In an alternative embodiment a coupling may be placed in parallel to a short stroke actuator. During acceleration the coupling transfers forces between the carrier and the intermediate body, whereas during a constant velocity of the stage the short stroke actuator (preferably a Lorentz actuator) can position the short stroke very accurately as the force on the coupling may be reduced resulting in a low stiffness. This is advantageous as the size and power dissipation of the Lorentz actuator can be reduced.

Figure 9:
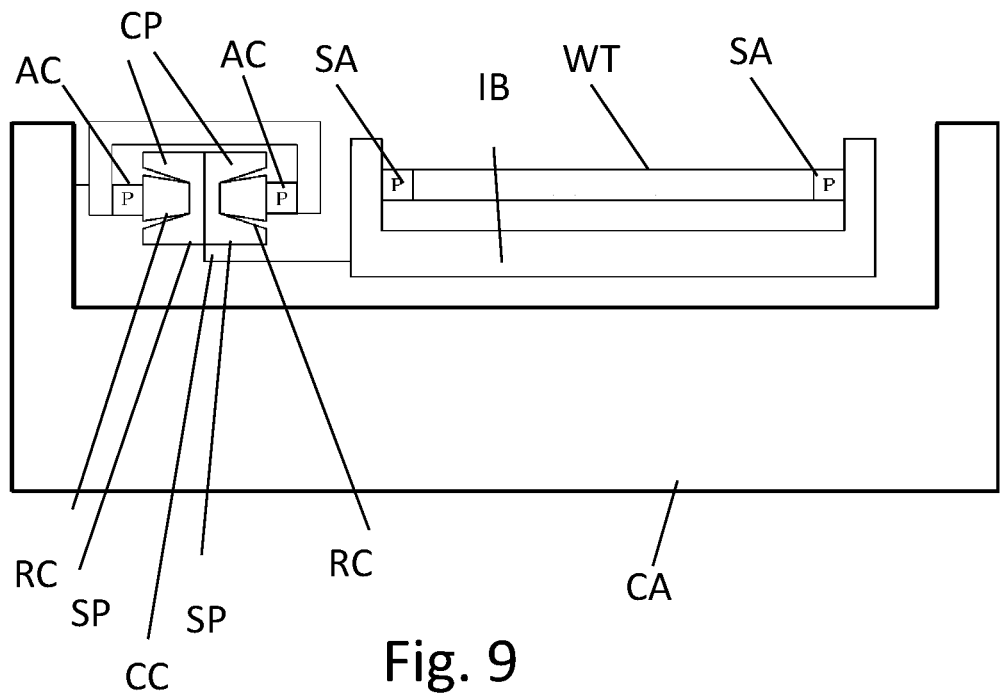
FIG. 9 depicts a highly schematic view of a yet further embodiment of a stage.

Alternatively, as depicted in FIG. 9, the recesses of the two couplings may face away from each other. In this embodiment, the deformable components are connected to each other, directly or, as depicted in FIG. 9, via additional actuators AC. The supports may be connected to each other possibly via a connecting component while the connecting component may be connected to the intermediate body.

Figure 8:
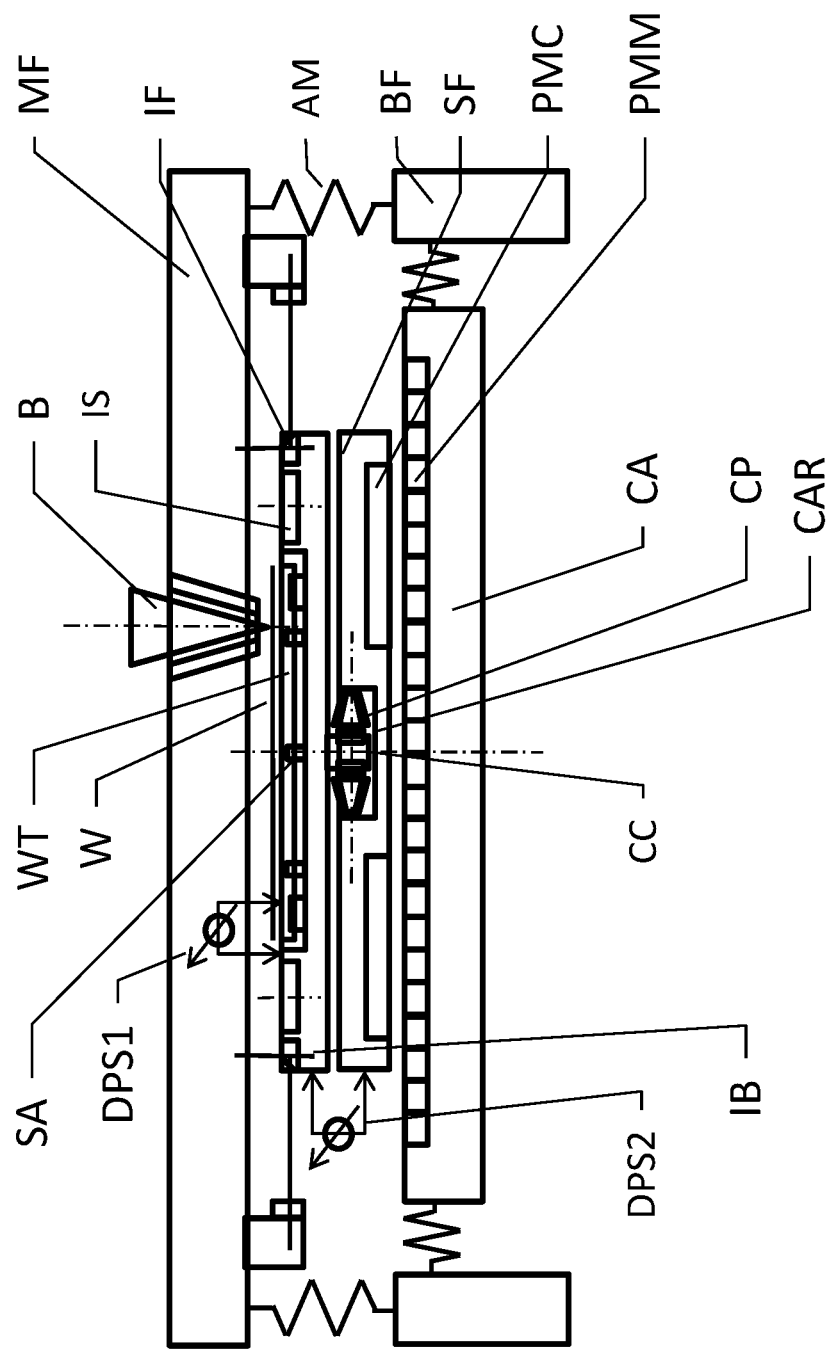
FIG. 8 depicts a highly schematic view of yet another embodiment of a stage.

FIG. 8 depicts a stage according to an embodiment. Likewise to the stage apparatus as depicted in and described with reference to FIGS. 6 and 7, the stage apparatus as depicted in FIG. 8 comprises a wafer table WT configured to support a wafer W. A short stroke actuator SA is arranged between the water table and an intermediate body IB and is configured to actuate the wafer table in respect of the intermediate body, thus to position the wafer table in respect of the intermediate body. The short stroke actuator may for example comprise piezo actuators. The stage apparatus further comprises a carrier CA and long stroke actuators, such as in the present example the planar motors PM having a planar motor coil PMC and a planar motor magnet plate PMM, configured to actuate the carrier. Similarly to the embodiment depicted in FIG. 7, the stage apparatus comprises two couplings CP arranged in opposite directions, seen along an axis of movement of the stage. The couplings may be arranged, seen in a plane of movement of the stage, at a center of the intermediate body, respectively at a center of the carrier, allowing for a more direct (stiff) connection between the coupling and the intermediate body. Preferably, the couplings are arranged in or close to a center of mass of the short stroke stage, e.g. a center of mass of a combination of intermediate body, wafer table and wafer. As a result of the arrangement of the couplings in a center of mass of the short stroke stage, the long stroke actuators may actuate in the center of mass of the combination of the intermediate body, the wafer table and the wafer, which at least reduces, or even prevents unwanted torques on the combination of the intermediate body. Similarly to the embodiments as explained with reference to FIGS. 6, 7 and 9, by means of the couplings, disturbances, such as vibrations and other forces acting on the carrier, may be isolated from the intermediate body, the wafer table and the wafer.

Interferometers IF may be provided to measure a position of the intermediate body in respect of a reference, such as in the present example the metrology frame MF. The metrology frame may be mounted to a base frame BF by means of a vibration isolation system, such as an air mount AM. A differential position sensor DPS1 may be provided to measure a position of the wafer table relative to the intermediate body. Accordingly, a position of the wafer table may be obtained from a combination of the position of the intermediate body as measured by the interferometers and relative position of the wafer table relative to the intermediate body as measured by the differential position sensor. A further differential position sensor DPS2 may be provided to measure a position of the intermediate body relative to the carrier CA, enabling a stage controller to drive the long stroke actuators so as to follow the position of the short stroke, i.e. the substrate table. In a practical implementation, the differential position sensor and the further differential position sensor may each be formed by a plurality of differential position sensors. The supports of the two couplings may be rigidly connected to each other and the couplings may be provided in a carrier recess CAR of the carrier, thereby enabling to drive the intermediate body proximate through the centre of mass. As a result, a moment on the intermediate body as a result of acceleration of the carrier may be kept at a low level. In the example shown, an image sensor IS is mounted at the intermediate body IB, since the position of these sensors may need to be accurately known relative to the wafer and vibration levels at these sensors may need to be minimized as well.

As the stage accelerates, the deformable component of a respective one of the couplings is pushed into the recess upon acceleration of the wafer table, causing an increase in stiffness of the coupling, thereby enabling to enhance a dynamic response of the wafer table. As the acceleration terminates, e.g. prior to a constant velocity of the stage, e.g. a scanning movement, the force on the coupling may be reduced, causing a stiffness of the coupling to be reduced, hence providing for a low stiffness, and a corresponding isolation of the intermediate body and wafer table from e.g. a vibrations and other disturbances.

As described above with reference to FIGS. 6 and 7, the couplings may comprise an actuator. A stage controller may be configured to actuate the actuator to push the deformable component into the recess upon acceleration of the wafer table. The actuator force may add to the force on the coupling due to the acceleration or deceleration, thereby increasing a force on the deformable component of the coupling, the increased force may provide the deformable component to exhibit a higher stiffness as the stage accelerates and faster settling after acceleration or deceleration of the stage.

The stage (i.e. the stage apparatus) as described with reference to FIGS. 6, 7, 8 and 9 respectively, may be comprised in a lithographic apparatus. Although the examples depicted in and described with reference to FIGS. 6-9 refer to a wafer table, the couplings may be applied in a mask table as well. Thus, instead of the wafer table configured to support a wafer, the stage may comprise a mask table configured to support a patterning device.

Although the FIGS. 6, 7, 8 and 9 depict and describe a coupling or couplings arranged to couple and decouple in a direction of the long stroke motor, i.e. in a direction of movement of the long stroke motor, the couplings may also be arranged in other directions. For example, a coupling or couplings may be arranged to couple and decouple in a direction in the horizontal plane, i.e. in the plane of movement of the stage, perpendicular to the long stroke direction. As a further example, a coupling or couplings may be arranged to couple and decouple in a direction perpendicular to the horizontal plane, i.e. perpendicular to the plane of movement of the stage. A combination of such couplings may provide that the stage is coupled and decoupled in 6 degrees of freedom. It is noted that the term coupled and decoupled refers to coupled in case the coupling is brought to the state of high stiffness, and decoupled in case the coupling is brought in the state of low stiffness.

Figure 10:
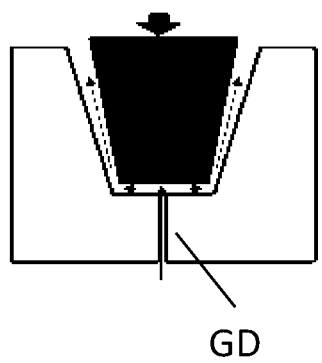
FIG. 10 depicts a highly schematic view of another embodiment of a coupling.

FIG. 10 depicts a further embodiment of the coupling in that the coupling, as described above with reference to FIGS. 5A and 5B, may further be provided with a gas duct GD that discharges into the recess for supplying a gas into the recess. Thereby, when the deformable component has been deformed to be confined by the recess, and the force is reduced or removed, a release of the deformable component from the recess side wall may be promoted, to thereby enhance a transition of the coupling from high to low stiffness.

FIG. 11A-11F depict still further embodiments of the coupling. As depicted in FIG. 11A-11F, the coupling may comprise at least one slot SL in the deformable material. In the undeformed state, i.e. in the state when the force is not applied onto the deformable component, the slots are open, e.g. leaving a space not filled by the deformable material. As the force is applied onto the deformable material, the deforming provides that the slots are at least partly closed, i.e. compressed, whereby the space not filled by the deformable material is reduced by the deformation of the deformable material. The slots effectively provide that, in the uncompressed state, the deformable component is enabled to deform into the open space of the slots, thereby exhibiting elastic deformation according to the Young's modulus. As the slots are at least partly closed, the deformation transitions into volumetric deformation. On the one hand, the stiffness of the deformable component itself increases by this transition. On the other hand, due to the tapering of the recess side wall, the force path will to a larger extent propagate through the support, hence further increasing stiffness. The slots may assist to reduce possible contamination, e.g. abrasion of the viscoelastic material. On the one hand, the interaction between the walls of the slot is an interaction between walls of the viscoelastic material. On the other hand, the slots are confined in the viscoelastic material.

Figure 11A:
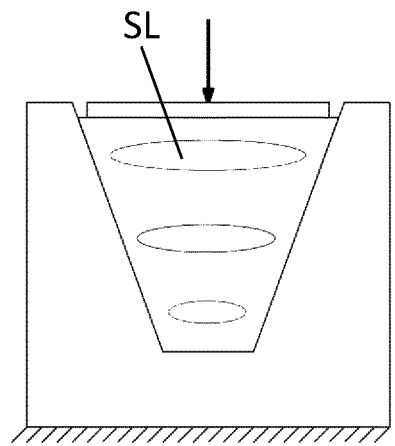
FIG. 11A-11F depicts a highly schematic view of further embodiments of a coupling.
Figure 11B:
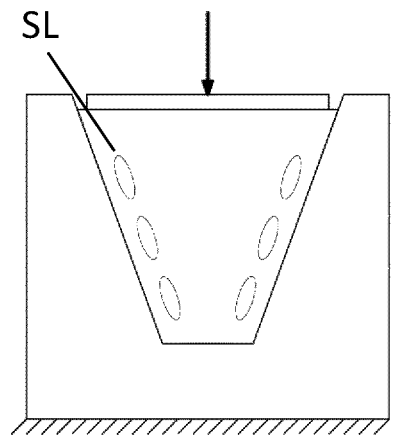
Figure 11C:
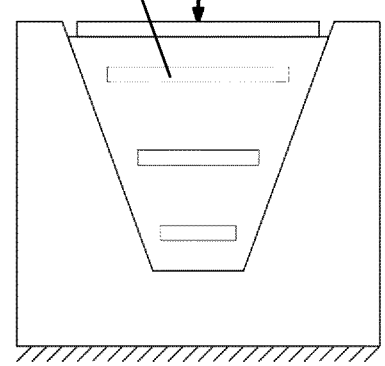
Figure 11D:
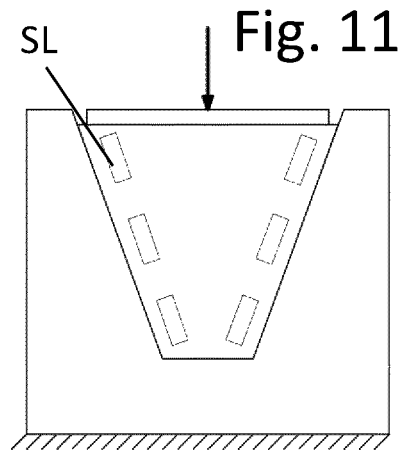
Figure 11E:
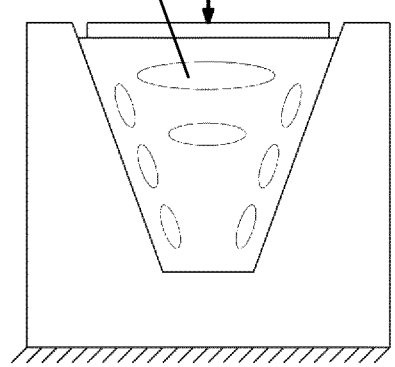
Figure 11F:
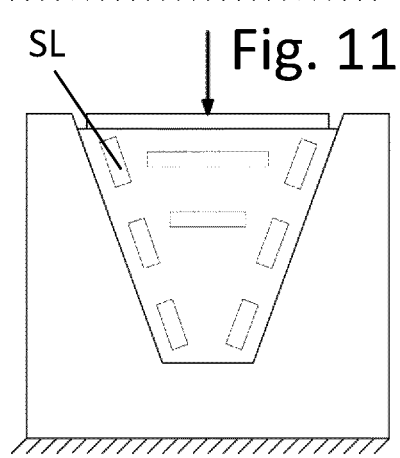

FIGS. 11A and 11C depicts ovally shaped respectively rectangularly shaped slots extending along the recess bottom. The slots are stacked. FIGS. 11B and 11D depict ovally shaped respectively rectangularly shaped slots extending along the recess side wall. The slots extend parallel to the recess side wall. FIGS. 11E and 11F depict respective combinations of ovally shaped respectively rectangularly shaped slots extending along the recess side wall and along the recess bottom. As the slots along the recess side wall and/or the slots along the recess bottom are compressed, the deformation transitions from elastic deformation into volumetric deformation, hence increasing stiffness as the force increases. Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Figure 12:
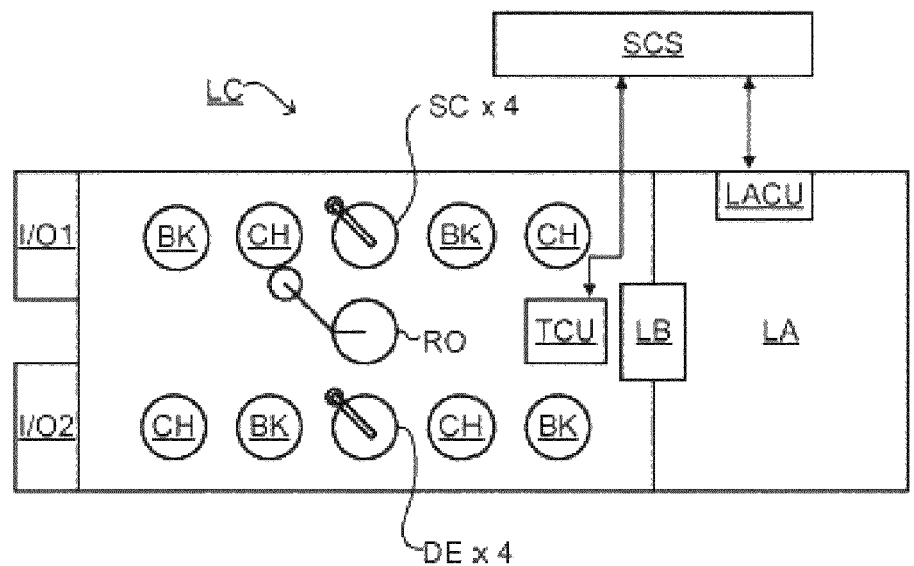
FIG. 12 schematically depicts a schematic overview of a lithographic cell.

As shown in FIG. 12 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 13:
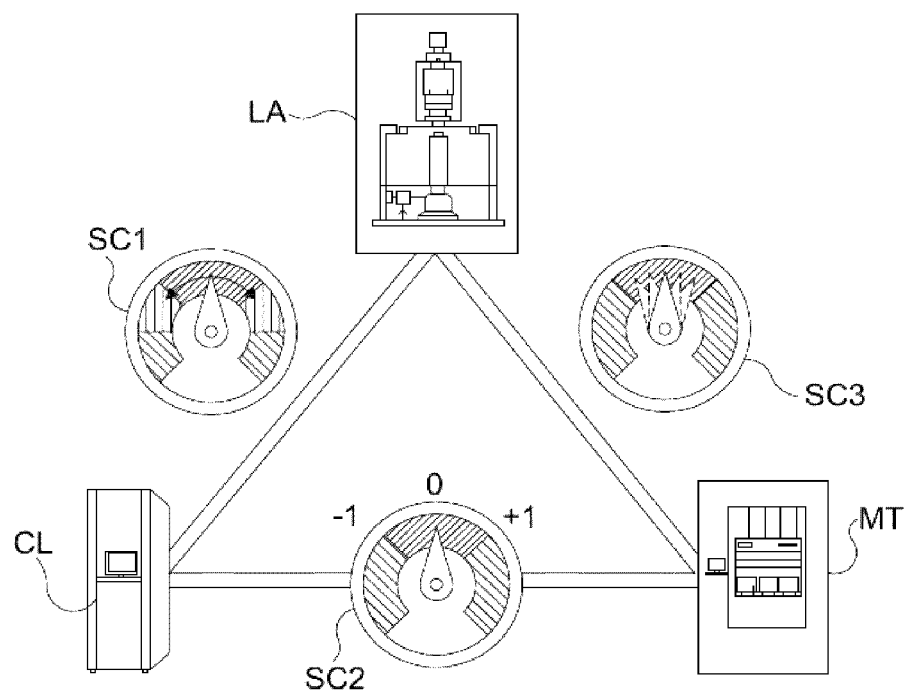
FIG. 13 schematically depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 13. One of these systems is the lithographic apparatus LA which is (virtually) connected to a metrology tool MT (a second system) and to a computer system CL (a third system). The key of such a "holistic" environment is to optimize the cooperation between these three systems to enhance the overall process window and to provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device) —typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 13 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 13 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

As mentioned above by reference to the FIGS. 1-3 and 12-13, the lithographic apparatus, the metrology tool and/or lithocell typically include a plurality of stage systems used to position a specimen, substrate, mask or sensor arrangement relative to a reference or another component. Examples thereof are the mask support MT and first positioner PM, the substrate support WT and the second positioner PW, the measurement stage arranged to hold a sensor and/or a cleaning device, and the stage used in the inspection tool MT where a substrate W is positioned relative to e.g. a scanning electron microscope or some kind of scatterometer. These apparatuses may include several other moving components such as a reticle stage, a wafer stage, mirrors, lens elements, light sources (e.g., a drive laser, an EUV source, etc.), a reticle masking stage, a wafer top cooler, wafer and reticle handlers, vibration isolation systems, stage torque compensators, software and/or hardware modules that control and/or include such components, and/or other components. These examples are not intended to be limiting.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting.

While specific embodiments of the invention have been described above, it will be appreciated that the invention may be practiced otherwise than as described. The descriptions above are intended to be illustrative, not limiting. Other aspects of the invention are set-out in the following numbered clauses:

1. A coupling having a variable stiffness, the coupling comprising:
   a deformable component and a support being movably arranged with respect to each other, wherein the deformable component comprises a viscoelastic material,
wherein the support has a recess configured to receive the deformable component,
wherein the deformable component is configured to deform in volumetric deformation when, in use, a force is applied to the deformable component, and
wherein a shape of the deformable component and a shape of the support are configured such that the variable stiffness gradually increases as a function of an amount of the force.

2. The coupling according to clause 1, wherein the deformable component supports on a part of a surface of the recess, and wherein the deformable component is configured to, when in use a force is applied which pushes the deformable component into the recess, deform to increase the part of the surface of the recess on which the deformable component supports.

3. The coupling according to clause 1 or clause 2, wherein the deformable component is configured to be at least partly confined by the recess, when in use the force is applied which pushes the deformable component into the recess.

4. The coupling according to any of the preceding clauses, wherein the recess comprises a recess bottom, and wherein the deformable component supports on the recess bottom in an undeformed state.

5. The coupling according to clause 4, wherein the recess is convergently shaped towards the recess bottom.

6. The coupling according to clause 5, wherein the recess tapers towards the recess bottom.

7. The coupling according to clause 5, wherein the recess converges towards the recess bottom parabolically or according to a polynomial or a logarithmic/exponential function.

8. The coupling according to any of the preceding clauses, wherein the recess further comprises a recess side wall, and wherein the deformable component does not support on the recess side wall in the undeformed state.

9. The coupling according to any of the preceding clauses, wherein the deformable component is provided with slots in the viscoelastic material, the slots being arranged to be compressed as the force is applied to the deformable component.

10. The coupling according to clause 9, wherein the slots extend along at least one of the recess side wall of the recess and the recess bottom of the recess.

11. The coupling according to any of the preceding clauses, further comprising an actuator configured to exert a force on the deformable component to push the deformable component into the recess.

12. The coupling according to any of the preceding clauses, further comprising a gas duct that discharges into the recess for supplying a gas into the recess.

13. A stage apparatus comprising:
    a table configured to support an object,
    an intermediate body,
    a short stroke actuator arranged between the table and the intermediate body and configured to actuate the table in respect of the intermediate body,
    a carrier,
    a long stroke actuator configured to actuate the carrier,
    a coupling configured to vary the stiffness thereof between a low stiffness and a high stiffness in dependence of a force applied to the coupling, the coupling configured to support the intermediate body in respect of the carrier.

14. A stage apparatus according to clause 13, comprising a coupling according to any of clauses 1-12.

15. The stage apparatus according to clause 13 or clause 14, comprising two couplings according to any of clauses 1-12, wherein the couplings are arranged in opposite direction seen along an axis of movement of the stage.

16. The stage apparatus according to clause 15, wherein the couplings are arranged along a force path between the intermediate body and the carrier.

17. The stage apparatus according to clause 15 or clause 16, wherein the deformable components of the two couplings are attached to the intermediate body and wherein the supports of the two couplings are attached to the carrier.

18. The stage apparatus according to any of clauses 15-17, wherein the supports of the two couplings are rigidly connected to each other, wherein the recesses of the two couplings face each other and wherein the stage apparatus comprises a connecting component that connects the deformable components of the couplings to each other and to the intermediate body.

19. The stage apparatus according to any of clauses 15-18, wherein the couplings are provided in a recess of the carrier.

20. The stage apparatus according to any of clauses 13-19, wherein the short stroke actuator comprises a piezo electric actuator.

21. The stage apparatus according to any of clauses 13-20, wherein the stage apparatus comprises:
    a table position measurement system configured to measure a position of the table in respect of the intermediate body, and
    an intermediate body position measurement system configured to measure a position of the intermediate body in respect of a reference structure.

22. The stage apparatus according to any of clauses 13-21, wherein the table is a wafer table, and the object is a wafer.

23. The stage apparatus according to any of clauses 13-22 wherein the table is a mask table, and the object is a patterning device.

24. A lithographic apparatus comprising a stage apparatus according to any of clauses 13-23.

25. A metrology apparatus comprising a stage apparatus according to any of clauses 13-23.

26. An inspection apparatus comprising a stage apparatus according to any of clauses 13-23.

27. The apparatus according to any of clauses 24-26, wherein the stage apparatus is configured to push the deformable component into the recess upon acceleration of the wafer table.

28. The apparatus according to any of clauses 24-26, wherein the coupling comprises the actuator, and wherein the apparatus is configured to actuate the actuator to push the deformable component into the recess upon acceleration of the wafer table.

The invention claimed is:

1. A coupling having a variable stiffness, the coupling comprising:
    a deformable component and a support being movably arranged with respect to each other,
    wherein the deformable component comprises a viscoelastic material,
    wherein the support has a recess configured to receive the deformable component, the recess comprising a recess bottom,
    wherein the deformable component is configured to deform in volumetric deformation when, in use, a force is applied to the deformable component, wherein a shape of the deformable component and a shape of the support are configured such that the variable stiffness gradually increases as a function of an amount of the force, wherein the deformable component supports on the recess bottom in an undeformed state, and wherein the recess is convergently shaped towards the recess bottom.

2. The coupling according to claim 1, wherein the deformable component is configured to, when in use a force is applied which pushes the deformable component into the recess, deform to increase a part of the surface of the recess on which the deformable component supports.

3. The coupling according to claim 1, wherein the deformable component is configured to be at least partly confined by the recess, when in use the force is applied which pushes the deformable component into the recess.

4. The coupling according to claim 1, wherein the recess tapers towards the recess bottom.

5. The coupling according to claim 1, wherein the recess converges towards the recess bottom parabolically or according to a polynomial or a logarithmic/exponential function.

6. The coupling according to claim 1, wherein the recess further comprises a recess side wall, and wherein the deformable component does not support on the recess side wall in the undeformed state.

7. The coupling according to claim 1, wherein the deformable component comprises slots in the viscoelastic material, the slots being arranged to be compressed as the force is applied to the deformable component.

8. The coupling according to claim 1, further comprising an actuator configured to exert a force on the deformable component to push the deformable component into the recess.

9. A stage apparatus comprising:
a table configured to support an object,
an intermediate body,
a short stroke actuator arranged between the table and the intermediate body and configured to actuate the table in respect of the intermediate body,
a carrier,
a long stroke actuator configured to actuate the carrier, and
a coupling configured to vary a stiffness thereof between a low stiffness and a high stiffness in dependence of a force applied to the coupling, the coupling configured to support the intermediate body in respect of the carrier.

10. The stage apparatus according to claim 9, wherein the coupling comprises:
a deformable component and a support being movably arranged with respect to each other,
wherein the deformable component comprises a viscoelastic material,
wherein the support has a recess configured to receive the deformable component, the recess comprising a recess bottom,
wherein the deformable component is configured to deform in volumetric deformation when, in use, a force is applied to the deformable component,
wherein a shape of the deformable component and a shape of the support are configured such that the variable stiffness gradually increases as a function of an amount of the force,
wherein the deformable component supports on the recess bottom in an undeformed state, and
wherein the recess is convergently shaped towards the recess bottom.

11. The stage apparatus according to claim 9, comprising two such couplings, wherein the couplings are arranged in opposite direction seen along an axis of movement of the stage.

12. The stage apparatus according to claim 11, wherein deformable components of the two couplings are attached to the intermediate body and wherein supports of the two couplings are attached to the carrier.

13. The stage apparatus according to claim 11, wherein supports of the two couplings are rigidly connected to each other, wherein recesses of the two couplings face each other and wherein the stage apparatus comprises a connecting component that connects deformable components of the couplings to each other and to the intermediate body.

14. The stage apparatus according to claim 9, wherein the short stroke actuator comprises a piezo electric actuator.

15. The stage apparatus according to claim 9, further comprising a table position measurement system configured to measure a position of the table in respect of the intermediate body, and an intermediate body position measurement system configured to measure a position of the intermediate body in respect of a reference structure.

16. The stage apparatus according to claim 9, wherein the table is a wafer table and the object is a wafer.

17. The stage apparatus according to claim 9, wherein the table is a mask table and the object is a patterning device.

18. A lithographic, metrology or inspection apparatus comprising the stage apparatus according to claim 9.

19. The lithographic, metrology or inspection apparatus according to claim 18, wherein the stage apparatus is configured to push the deformable component into the recess upon acceleration of the table.

20. The lithographic, metrology or inspection apparatus according to claim 18, wherein the coupling comprises the short stroke actuator, and wherein the lithographic, metrology or inspection apparatus is configured to actuate the short stroke actuator to push the deformable component into the recess upon acceleration of the table.

* * * * *